(12) United States Patent
Wang et al.

(10) Patent No.: US 8,264,039 B2
(45) Date of Patent: Sep. 11, 2012

(54) HIGH-VOLTAGE LDMOSFET AND APPLICATIONS THEREFOR IN STANDARD CMOS

(75) Inventors: Bin Wang, Seattle, WA (US); William T. Colleran, Seattle, WA (US); Chih-Hsin Wang, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 1365 days.

(21) Appl. No.: 10/952,708

(22) Filed: Sep. 28, 2004

(65) Prior Publication Data

US 2005/0258461 A1  Nov. 24, 2005

Related U.S. Application Data

(63) Continuation-in-part of application No. 10/884,236, filed on Jul. 2, 2004, and a continuation-in-part of application No. 10/884,326, filed on Jul. 2, 2004.

(60) Provisional application No. 60/565,553, filed on Apr. 26, 2004.

(51) Int. Cl.
*H01L 29/78* (2006.01)
(52) U.S. Cl. ........ 257/339; 257/335; 257/409; 257/397; 257/E29.256; 257/E29.268
(58) Field of Classification Search ............... 257/341, 257/509, 544–549, 333, 395–400, 339, 409
See application file for complete search history.

(56) References Cited

U.S. PATENT DOCUMENTS

| | | | |
|---|---|---|---|
| 4,697,332 A | 10/1987 | Joy et al. | |
| 4,745,079 A | 5/1988 | Pfiester | |
| 5,485,027 A * | 1/1996 | Williams et al. | 257/343 |
| 5,553,030 A | 9/1996 | Tedrow et al. | |
| 5,585,660 A | 12/1996 | Mei | |

(Continued)

FOREIGN PATENT DOCUMENTS

WO  WO 2004/006340 A1  1/2004

OTHER PUBLICATIONS

Bassin, et al., "High-Voltage Devices for 0.5-μm Standard CMOS Technology", IEEE Electron Device Letters, vol. 21, No. 1, Jan. 2000, pp. 41-42.

(Continued)

*Primary Examiner* — Matthew W Such
*Assistant Examiner* — Abul Kalam
(74) *Attorney, Agent, or Firm* — Fenwick & West LLP

(57) ABSTRACT

A high-voltage LDMOSFET includes a semiconductor substrate, in which a gate well is formed. A source well and a drain well are formed on either side of the gate well, and include insulating regions within them that do not reach the full depth. An insulating layer is disposed on the substrate, covering the gate well and a portion of the source well and the drain well. A conductive gate is disposed on the insulating layer. Biasing wells are formed adjacent the source well and the drain well. A deep well is formed in the substrate such that it communicates with the biasing wells and the gate well, while extending under the source well and the drain well, such as to avoid them. Biasing contacts at the top of the biasing wells bias the deep well, and therefore also the gate well.

19 Claims, 11 Drawing Sheets

U.S. PATENT DOCUMENTS

| | | | |
|---|---|---|---|
| 5,593,909 | A | 1/1997 | Han et al. |
| 5,751,042 | A | 5/1998 | Yu |
| 5,753,952 | A | 5/1998 | Mehrad |
| 6,023,188 | A | 2/2000 | Lee et al. |
| 6,097,070 | A | 8/2000 | Mandelman et al. |
| 6,160,289 | A | 12/2000 | Kwon et al. |
| 6,160,290 | A | 12/2000 | Pendharkar et al. |
| 6,177,830 | B1 | 1/2001 | Rao |
| 6,211,552 | B1 | 4/2001 | Efland et al. |
| 6,350,637 | B1 | 2/2002 | Maurelli et al. |
| 6,461,918 | B1 | 10/2002 | Calafut |
| 6,548,874 | B1 | 4/2003 | Morton et al. |
| 6,555,883 | B1 | 4/2003 | Disney et al. |
| 6,559,683 | B1 * | 5/2003 | Kwon et al. .......... 327/43 |
| 6,593,621 | B2 | 7/2003 | Tsuchiko et al. |
| 6,661,278 | B1 | 12/2003 | Gilliland |
| 6,665,012 | B1 | 12/2003 | Yang et al. |
| 6,678,190 | B2 | 1/2004 | Yang et al. |
| 6,730,458 | B1 | 5/2004 | Kim et al. |
| 6,734,493 | B2 | 5/2004 | Chen et al. |
| 6,831,331 | B2 * | 12/2004 | Kitamura et al. ............ 257/343 |
| 6,873,021 | B1 * | 3/2005 | Mitros et al. .............. 257/409 |
| 6,882,023 | B2 | 4/2005 | Khemka et al. |
| 6,989,302 | B2 | 1/2006 | Makovicka et al. |
| 7,091,535 | B2 | 8/2006 | Tsai et al. |
| 2002/0028541 | A1 | 3/2002 | Lee et al. |

OTHER PUBLICATIONS

Declercq, et al., "Design and Optimization of High-Voltage CMOS Devices Compatible with a Standard 5 V CMOS Technology", IEEE Custom Integrated Circuits Conference, 1993, pp. 24.6.1-24.6.4.

Dickson, "On-Chip High-Voltage Generation in MNOS Integrated Circuits Using an, Improved Voltage Multiplier Technique", IEEE Journal of Solid-State Circuits, vol. SC-11, No. 3, Jun. 1976, pp. 374-378.

Favrat, et al., "A High-Efficiency CMOS Voltage Doubler", IEEE Journal of Solid-State Circuits, vol. 33, No. 3, Mar. 1998, pp. 410-416.

Witters, et al., "Analysis and Modeling of On-Chip High-Voltage Generator Circuits for Use in EEPROM Circuits", IEEE Journal of Solid-State Circuits, vol. 24, No. 5, Oct. 1989, pp. 1372-1380.

Vishnu Khemka et al., "A Floating RESURF (FRESURF) LD-MOSFET Device Concept", IEEE Electron Device Letters, vol. 24, No. 10, Oct. 2003, pp. 664-666.

United States Office Action, U.S. Appl. No. 11/490,407, Mar. 3, 2011, 4 pages.

Declercq, M. et al., "Design and Optimization of High-Voltage CMOS Devices Compatible with a Standard 5V CMOS Technology," IEEE 1993 Custom Integrated Circuits Conference, pp. 24.6.1-24.6.4.

United States Office Action, U.S. Appl. No. 11/490,407, Aug. 5, 2011, 5 pages.

United States Office Action, U.S. Appl. No. 11/490,407, Oct. 13, 2010, 4 pages.

United States Office Action, U.S. Appl. No. 11/490,407, Mar. 17, 2010, 13 pages.

United States Office Action, U.S. Appl. No. 11/490,407, Aug. 5, 2009, 9 pages.

United States Office Action, U.S. Appl. No. 11/490,407, Nov. 24, 2008, 10 pages.

United States Office Action, U.S. Appl. No. 11/138,888, Jun. 22, 2007, 16 pages.

United States Office Action, U.S. Appl. No. 11/138,888, Nov. 17, 2006, 19 pages.

United States Office Action, U.S. Appl. No. 11/138,888, Sep. 11, 2007, 3 pages.

United States Office Action, U.S. Appl. No. 10/884,236, Dec. 15, 2005, 4 pages.

United States Office Action, U.S. Appl. No. 10/884,236, Mar. 26, 2007, 16 pages.

United States Office Action, U.S. Appl. No. 10/884,326, Dec. 15, 2005, 4 pages.

* cited by examiner

US 8,264,039 B2

HIGH-VOLTAGE LDMOSFET AND APPLICATIONS THEREFOR IN STANDARD CMOS

RELATED APPLICATIONS

This application claims the benefit of U.S. Provisional Patent Application Ser. No. 60/565,553 filed Apr. 26, 2004 in the name of the inventor Bin Wang and commonly assigned herewith. This application is a Continuation-In-Part of U.S. patent application Ser. No. 10/884,236 filed on Jul. 2, 2004, entitled "Native High-Voltage N-Channel LDMOSFET in Standard Logic CMOS" in the name of inventor Bin Wang and commonly assigned herewith. This application is also a Continuation-In-Part of U.S. patent application Ser. No. 10/884,326 filed on Jul. 2, 2004, entitled "Graded-Junction High-Voltage MOSFET in Standard Logic CMOS" in the name of inventor Bin Wang and commonly assigned herewith.

FIELD OF THE INVENTION

The present invention relates generally to high-voltage transistors, i.e., transistors designed to handle voltages in excess of their nominal power requirements (Vdd-Vss). More particularly, the present invention relates to a high-voltage LDMOSFET (laterally diffused metal oxide semiconductor field effect transistor) fabricated in a standard logic CMOS (complementary MOS) process.

BACKGROUND

LDMOSFETs (Laterally Diffused MOSFETs) are known. Such devices are used as high-voltage switches and components in devices fabricated in various MOS process (fabrication) technologies including logic CMOS and the like, but having a need for relatively high-voltage capabilities (e.g., 10 volts in a 3.3 volt process). Such high-voltages are used in charge pumps, programming nonvolatile memory circuits, on-chip liquid crystal display drivers, on-chip field-emission display drivers, and the like. A typical LDMOSFET 10 (also referred to as an LDMOS) is shown in elevational cross-section in FIG. 1. LDMOS 10 is formed in a substrate 12 of p-type conductivity. A first heavily doped region of n-type conductivity ("first n+ region") 13 is disposed in a first well of a p-type conductivity ("first p– well") 14 of the substrate 12. A source terminal 16 is coupled to the first n+ region 13. A heavily doped region of p-type conductivity ("p+ region") 18 is disposed in a second well of p-type conductivity ("second p– well") 15. A p+ doped region 18 is disposed in second p– well 15. A body terminal 20 is coupled to p+ doped region 18. A well of n-type conductivity ("n– well") 22 is disposed in the substrate 12 between the first p– well 14 and the second p– well 15. A first isolation structure 23, such as a first trench 24, is disposed in the n– well 22. The first isolation structure 23 such as first trench 24 is filled with an insulating dielectric material such as silicon dioxide which may be deposited or grown in any convenient manner such as using the well-known Shallow Trench Isolation (STI) process (as shown) or the well-known Local Oxidation of Silicon (LOCOS) process (not shown). A second heavily doped region of the n-type conductivity ("second n+ region") 28 is disposed in the n– well 22. A drain terminal 30 is coupled to the second n+ region 28. A second isolation structure 25, such as a trench 26, is disposed at least partially in the n– well 22, and acts to isolate second the n+ region 28 from the p+ region 18. A layer of dielectric 33 is disposed over a portion of the first p– well 14, the p– well/n– well junction region 34, a portion of n– well 22 and a portion of the first trench 24. In fact, the material of dielectric 33 may be the same as the material of first trench 24, if desired. A gate 32 is in contact with the dielectric layer 33 as well as the dielectric material in the first trench 24. Gate region 32 may comprise n+ doped polysilicon material, p+ doped polysilicon material, metal, or any other suitable material used for forming a conductive gate. Insulating sidewall spacers 36 and 38 are also provided. The channel of the device extends from the source region 13 to the first isolation structure 23, as shown. The region denoted Lw is a region of lateral diffusion of the n– well 22 under the gate and Lw denotes its length.

In this device the n– well 22 is used as the drain of the device. A high breakdown voltage is provided due to lateral diffusion in the region denoted Lw under the gate. This structure results in deep junctions with lower doping than that of a typical n+ drain. The breakdown voltage is determined by the doping concentrations in the n– well 22 (approximately $10^{17}$ atoms/cm$^3$) and p– well 14 (approximately $10^{17}$ atoms/cm$^3$) of the n-well/p-well junction 34. The prior art embodiment shown uses shallow trench isolation (STI). Similar embodiments implementing a LOCOS isolation scheme are also well known in the art.

P-Channel high-voltage MOSFETs are also known. Turning now to FIG. 2, such a device 40 is illustrated in elevational cross section. The device 40 is fabricated in an n– well 42 of a substrate of p-type conductivity ("p-substrate") 44. Its source 46 is a heavily doped diffusion region of p-type conductivity, disposed in n– well 42. Its drain 48 is a heavily doped diffusion region of p-type conductivity, formed in a lightly doped diffusion region 50 of p-type conductivity, which can be formed out of a "channel stop" implant using boron doping. A body contact 52 is formed by an n+ diffusion in the n– well 42. A gate 54 formed of a conductive material such as heavily doped polysilicon or metal overlies a layer of dielectric 55 (such as Silicon dioxide gate oxide) which, in turn, overlies a portion of the source region 46 and the p-diffusion region 50 as shown. A pair of isolation structures 56 and 58 such as field oxide formed with a LOCOS (local oxidation of silicon) process or an STI (shallow trench isolation) process are formed on either side of the drain region 48. The p– diffusion region 50 extends from insulating structure 58, under drain region 48 and under insulating structure 56. The breakdown voltage is determined by the doping concentrations in the n– well 42 (approximately $10^{17}$ atoms/cm$^3$) and p– diffusion region 50 (approximately $10^{17}$ atoms/cm$^3$) of the n-well/p-diffusion junction 59.

As device geometries and minimum feature sizes (MFS) shrink, e.g., from 0.18 micron MFS to 0.13 micron MFS to 0.09 micron MFS and beyond, new ways to provide relatively high breakdown voltages, particularly in standard CMOS processes, become more and more important. Accordingly, it is highly desirable to provide an improved high-voltage switching device. It is also highly desirable to provide an n-channel and a p-channel high-voltage switching device, so that a high-voltage CMOS inverter and high-output-voltage analog amplifier as well as a circuit with a relatively high voltage output for a relatively low input voltage Vdd may be fabricated.

SUMMARY

A high-voltage LDMOSFET includes a semiconductor substrate, in which a gate well region is formed. A source well region and a drain well region are formed on either side of the gate well region, and include insulating regions within them that do not reach the full depth. An insulating layer is disposed on the substrate, covering the gate well region and a portion of the source well region and the drain well region. A conductive gate is disposed on the insulating layer. A biasing well region is formed adjacent the source well region or the drain well region or both. A deep well region is formed in the substrate such that it communicates with the biasing well region and the gate well region, while extending under the source well region and the drain well region, such as to avoid them. Biasing contacts at the top of the biasing well regions bias the deep well region, and therefore also the gate well region. In other embodiments, two biasing well regions are provided that, in combination with the deep well region, also insulate the source well region and the drain well region from the substrate.

Trench isolation of various types, LOCOS based isolation schemes, and other suitable processes may be used for forming the isolation structures.

Other aspects of the inventions are described and claimed below, and a further understanding of the nature and advantages of the inventions may be realized by reference to the remaining portions of the specification and the attached drawings.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention described in the following detailed description are directed at high-voltage LDMOSFET devices and applications. Those of ordinary skill in the art will realize that the detailed description is illustrative only and is not intended to restrict the scope of the claimed inventions in any way. Other embodiments of the present invention, beyond those embodiments described in the detailed description, will readily suggest themselves to those of ordinary skill in the art having the benefit of this disclosure. Reference will now be made in detail to implementations of the present invention as illustrated in the accompanying drawings. Where appropriate, the same reference indicators will be used throughout the drawings and the following detailed description to refer to the same or similar parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, the symbol n+ indicates an n-doped semiconductor material typically having a doping level of n-type dopants on the order of $10^{20}$ atoms per cubic centimeter. The symbol n– indicates an n-doped semiconductor material typically having a doping level on the order of $10^{17}$ atoms per cubic centimeter for n-doped wells and on the order of $10^{15}$ atoms per cubic centimeter for n-substrate material. The symbol p+ indicates a p-doped semiconductor material typically having a doping level of p-type dopants on the order of $10^{20}$ atoms per cubic centimeter. The symbol p– indicates a p-doped semiconductor material typically having a doping level on the order of $10^{17}$ atoms per cubic centimeter for p–doped wells and on the order of $10^{15}$ atoms per cubic centimeter for p– substrate material. Those of ordinary skill in the art will now also realize that a range of doping concentrations around those described is suitable for the present purposes. Essentially, any process capable of forming pFETs and nFETs is suitable for the present purposes. Doped regions may be diffusions or they may be implanted. When it is written that something is doped at approximately the same level as something else, the doping levels are within approximately a factor of ten of each other, e.g., $10^{16}$ is within a factor of ten of $10^{15}$ and $10^{17}$.

Figure 3:
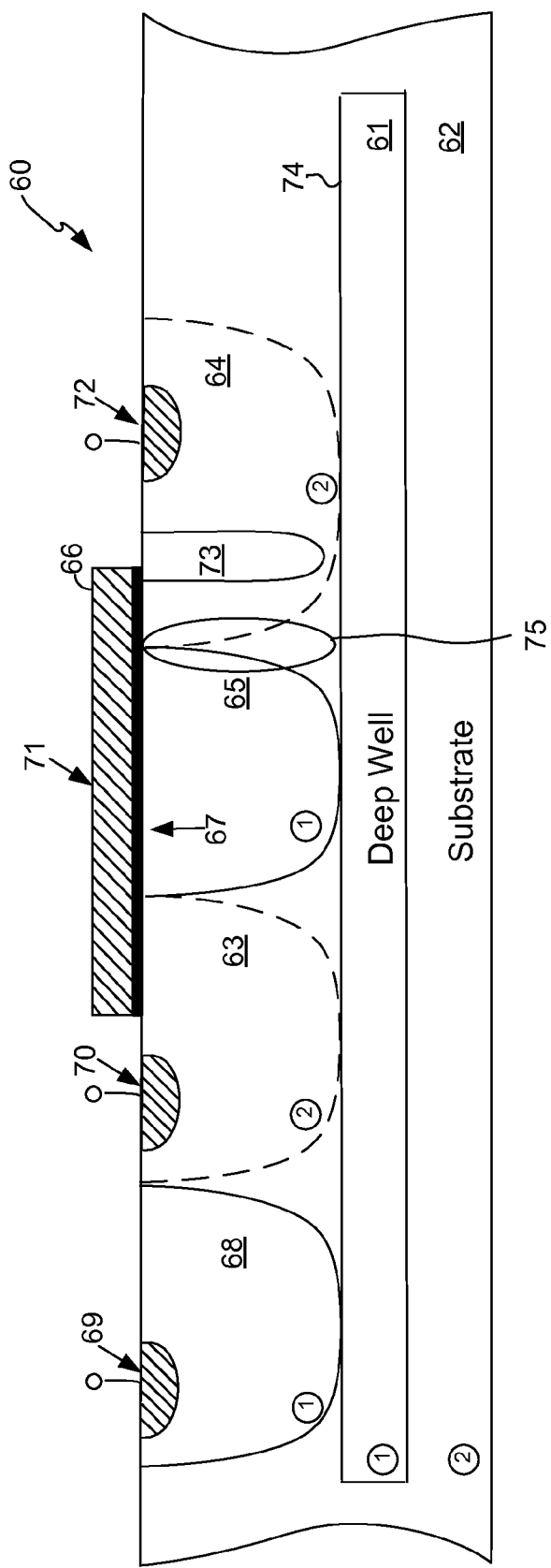
FIG. 3 is an elevational cross-sectional diagram of elements of a LDMOSFET in accordance with one embodiment of the present invention.

FIG. 3 is an elevational cross-sectional diagram of elements of an LDMOSFET 60 in accordance with one embodiment of the present invention. In accordance with the invention of FIG. 3, the LDMOSFET 60 is formed in a substrate 62 of a second conductivity type (2). A deep well region 61 of a first conductivity type (1) is formed in the substrate 62, also known as deep well. If the first conductivity type is p, then the second conductivity type is n and vice versa. A source well region 63 and a drain well region 64 of the second conductivity type are formed, which are also known as source well 63 and drain well 64. A gate well region 65 of the first conductivity type, also known as gate well 65, is formed between the source well 63 and the drain well 64. The gate well region 65 is electrically coupled to the deep well region 61. A conductive gate 66 is disposed over the gate well region 65 and a portion of the source well region 63 and the drain well region 64, and is separated from them by an insulating layer 67 which may be an oxide (silicon dioxide) or other suitable insulator.

A biasing well region 68 of the first conductivity type, which is also known as biasing well 68, is formed in the substrate 62, near either source well region 63 or drain well region 64. The biasing well 68 is electrically coupled to the deep well region 61, so that it may be used to provide a bias signal to the deep well region 61, and from there to the gate well region 65. Contacts 69, 70, 71 and 72 are provided to the biasing well region 68, the source well region 63, the conductive gate 66 and the drain well region 64, respectively, in a conventional manner (e.g., n+ doped diffusion region for an n− well or n− substrate region and p+ doped diffusion region for a p− well or p− substrate region). Source well region 63 and drain well region 64 may be wells of the second conductivity type (e.g., doped to a dopant concentration of the order of about $10^{17}$ atoms of dopant per cubic centimeter, or they may be substrate material of the second conductivity type (e.g., doped to a dopant concentration of the order of about $10^{15}$ atoms of dopant per cubic centimeter). Doping may be achieved by any suitable mechanism. An isolation structure 73 disposed in the drain well region 64 and formed of an insulating material disposed from the top of the substrate not quite to the upper surface 74 of deep well region 61 provides high-voltage capability by isolating the drain contact 72 from the drain/gate well junction 75.

It will be understood that the elements shown in FIG. 3 are intended as those of a minimum embodiment, not necessarily a full schematic. More items may be included than those shown, for device 60 to be a high voltage device. The embodiment of FIG. 3 can work for purposes different than a high-voltage device, with different doping amounts than those of the preferred embodiments recommended in this document. If, however, one artificially considers the embodiment of FIG. 3 with those elements alone, it may have problems as a high voltage device, since one or both of source well region 63 and drain well region 64 may be shorted to substrate 62. The same applies also to the embodiments of FIG. 4 and FIG. 5.

Figure 4:
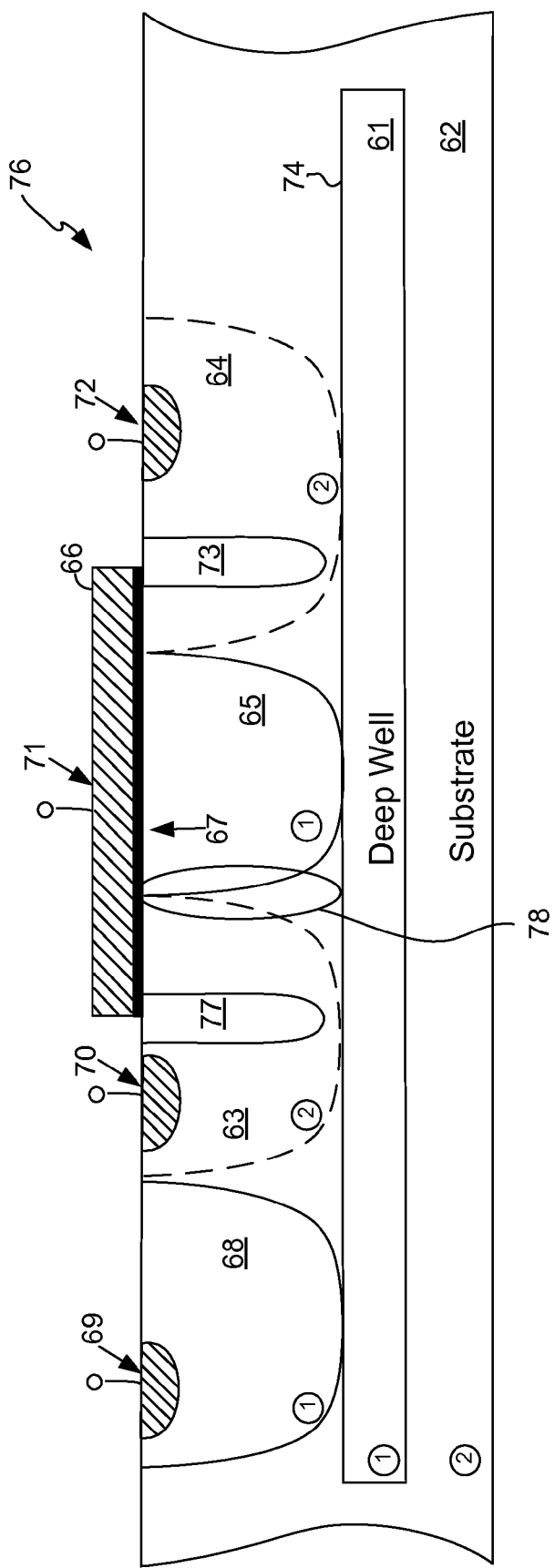
FIG. 4 is an elevational cross-sectional diagram of elements of a LDMOSFET in accordance with another embodiment of the present invention.

FIG. 4 is an elevational cross-sectional diagram of elements of a LDMOSFET 76 in accordance with another embodiment of the present invention. This embodiment of the present invention differs from that illustrated in FIG. 3 in that an additional isolation structure 77 is disposed in source well region 63 and formed of an insulating material disposed from the top of the substrate not quite to the upper surface 74 of deep well region 61 and, likewise, provides high-voltage capability by isolating the source contact 70 from the source/gate well junction 78.

Figure 5:
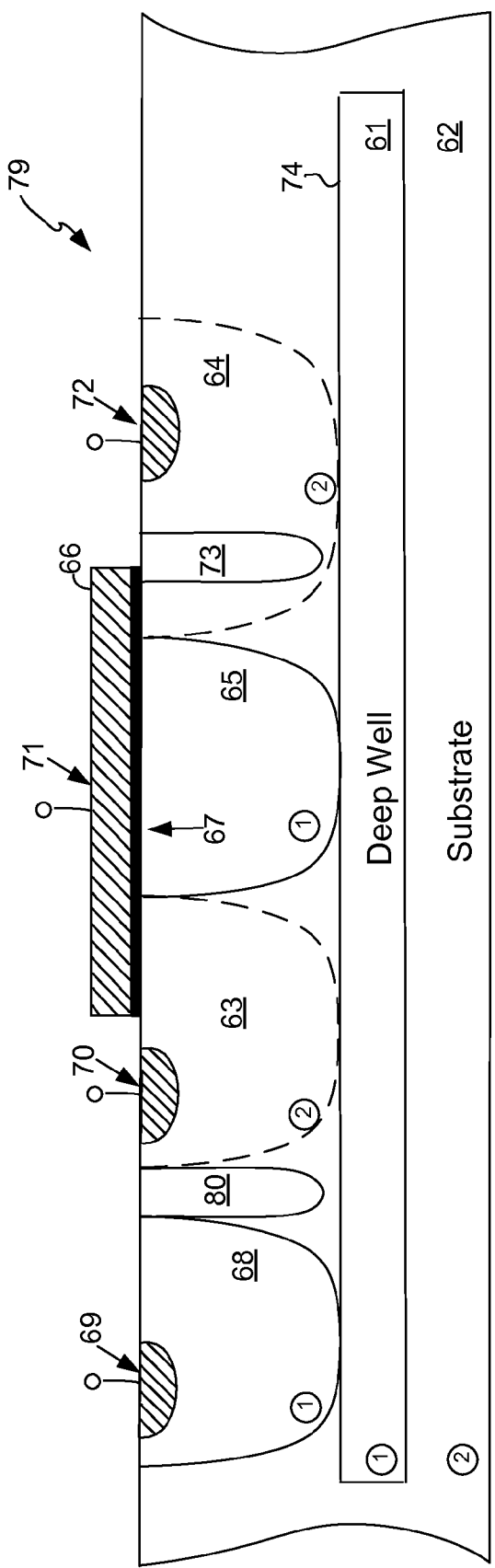
FIG. 5 is an elevational cross-sectional diagram of elements of a LDMOSFET in accordance with another embodiment of the present invention.

FIG. 5 is an elevational cross-sectional diagram of elements of a LDMOSFET 79 in accordance with another embodiment of the present invention. This embodiment of the present invention differs from that illustrated in FIG. 3 in that an additional isolation structure 80 is disposed between the source contact 70 and the biasing well contact 69. The isolation structure 80 is formed of an insulating material disposed from the top of the substrate not quite to the upper surface 74 of the deep well region 61 and assists in isolating the source contact 70 from the well contact 69.

Figure 6:
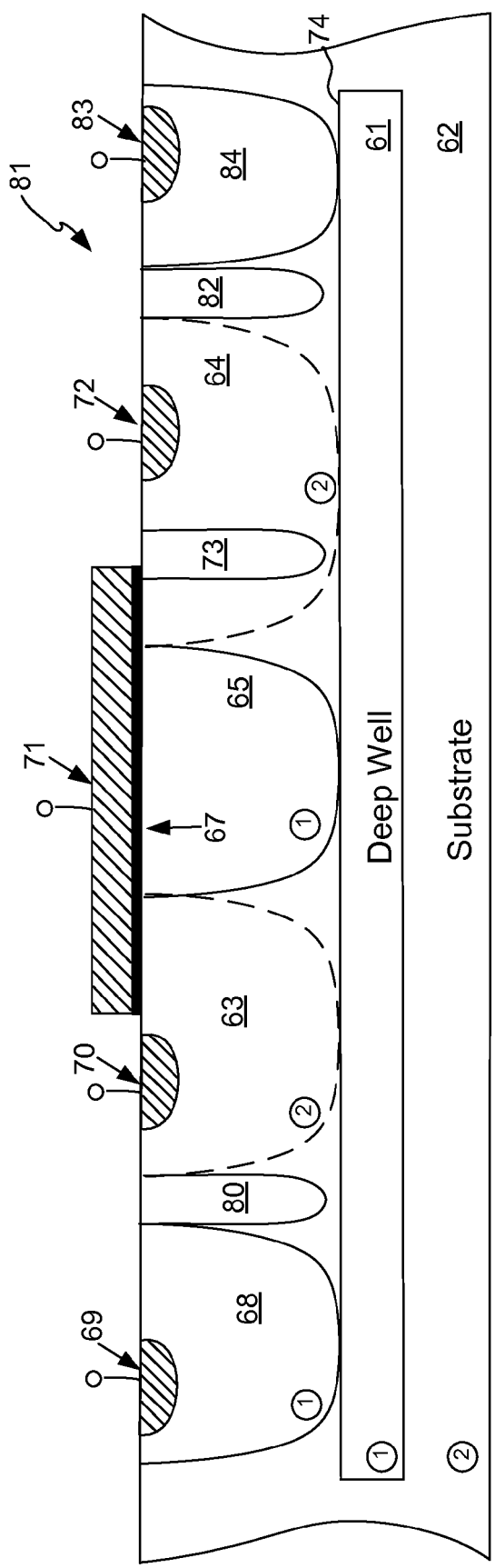
FIG. 6 is an elevational cross-sectional diagram of elements of a high-voltage LDMOSFET in accordance with yet another embodiment of the present invention.

FIG. 6 is an elevational cross-sectional diagram of a high-voltage LDMOSFET 81 in accordance with another embodiment of the present invention. This embodiment of the present invention differs from that illustrated in FIG. 5 in that a second biasing well 84 is provided, having a second biasing well contact 83. The second biasing well 84 is provided on the opposite side of first biasing well 68, with respect to the gate region 65.

In some embodiments, an additional isolation structure 82 is disposed between the second biasing well 84 and the drain well region 64. The isolation structure 82 is formed of an insulating material disposed from the top of the substrate not quite to the upper surface 74 of deep well region 61, and assists in isolating the drain contact 72 from the second biasing well contact 83.

In some embodiments, the first biasing well region 68, together with the second biasing well region 84 and the deep well region 61 are formed such that they insulate the source well region 63 and the drain well region 664 from the substrate 62. This is preferred for high voltage operation.

Figure 7:
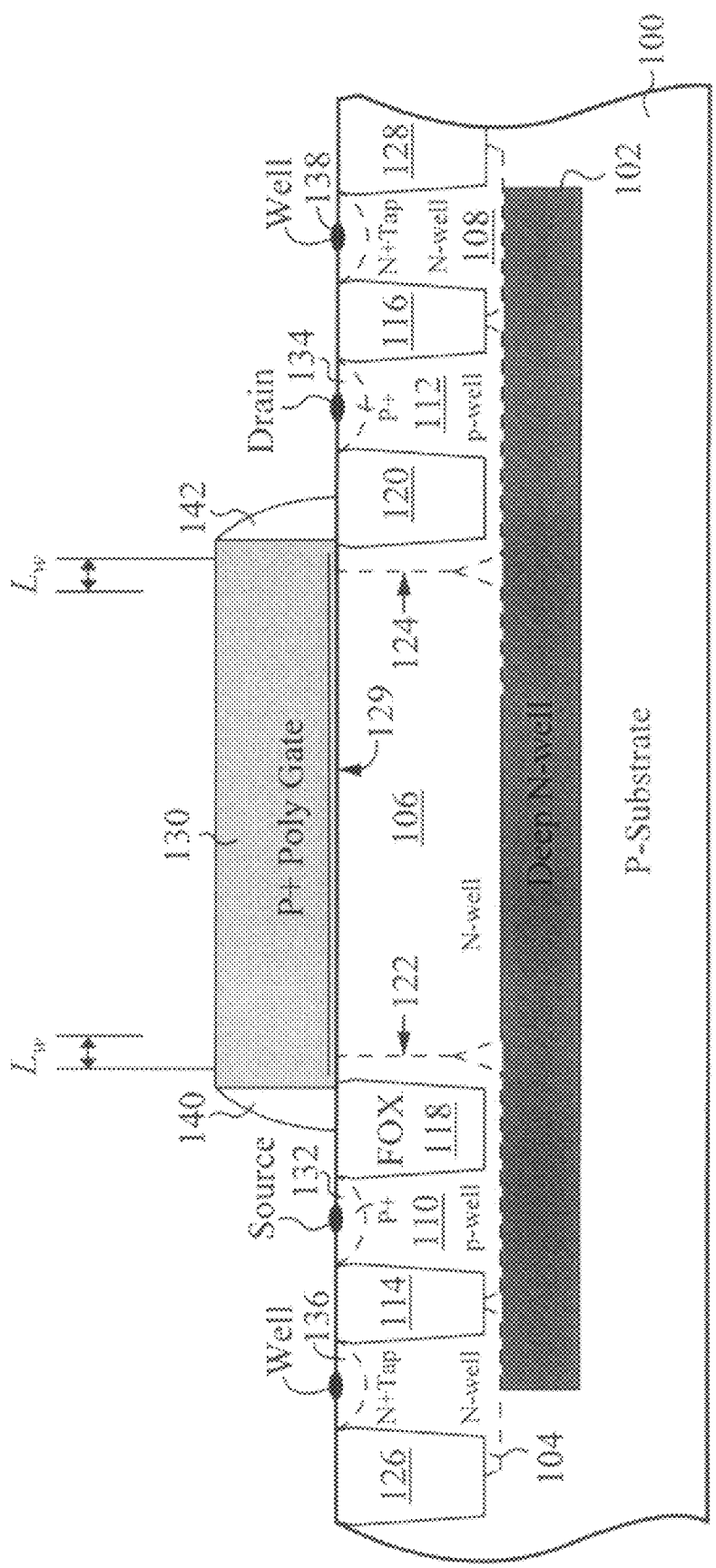
FIG. 7 is an elevational cross-sectional diagram of a high-voltage p-channel LDMOSFET in accordance with an embodiment of the present invention.

Turning now to FIG. 7, a p− substrate 100 is provided with a deep n− well 102 through a high-energy ion implantation process well known to those of ordinary skill in the art. Over deep n− well 102 are formed in an embodiment of the present invention, first, second and third n− wells 104, 106 and 108 and first and second p− wells 110 and 112. First and second isolation structures 114 and 116 separate n− wells 104 and 108, respectively, from p− wells 110 and 112. Third and fourth isolation structures 118 and 120 are embedded within p− wells 110 and 112, respectively and thereby provide a relatively long path from their respective source and drain to corresponding p− well/n− well junctions 122, 124. These isolation structures, together with additional isolation structures 126 and 128 are formed of insulating material such as field oxide formed of silicon dioxide, silicon oxynitride, and the like. They may be formed with a LOCOS process or an STI process, for example. An insulating layer 129 is formed on substrate 100, similarly to layer 67 of FIG. 3. Insulating layer 129 is on such a portion of substrate 100 that covers at least portions of p− wells 110 and 112, and n− well 106 between them. A conductive gate 130 is disposed on insulating layer 129. A channel is formed under insulating layer 129 between p− wells 110 and 112, due to biasing of gate 130. A drain 132 and a source 134 may be p+ diffusion regions disposed in respective p− wells 110 and 112. Well or body contacts 136, 138 are also provided as n+ diffusion regions disposed in n− wells 104/108 as shown. Deep n− well 102 also serves to electrically couple n− well 104 with n− well 106 and n− well 108. Insulators 140, 142 insulate conductive gate 130 from other parts of the device. Conductive gate 130 may be formed from a heavily doped semiconductor material such as p+ polysilicon or a metal.

The dimensions of various portions of the device of FIG. 7 depend upon the magnitude of the voltage that is intended to power the device, and the magnitude of the voltages and currents that it will control. The dimension Lw is properly measured within substrate 100. Dimension Lw represents the thickness of the portion of p-well 110 that is between isolation structure 118 and n− well 106, and the thickness of the portion of p-well 112 that is between isolation structure 120 and n− well 106. These dimensions are shown as equal for the left and the right of n− well 106. This is shown as an example, but not as limitation, and the invention may be practiced with these dimensions being unequal. In general, dimension Lw needs to be wider for larger current carrying devices, and may be smaller if lesser currents are involved. Those of ordinary skill in the art will now be readily able to choose such dimensions based upon their particular application in view of the present description.

Figure 8:
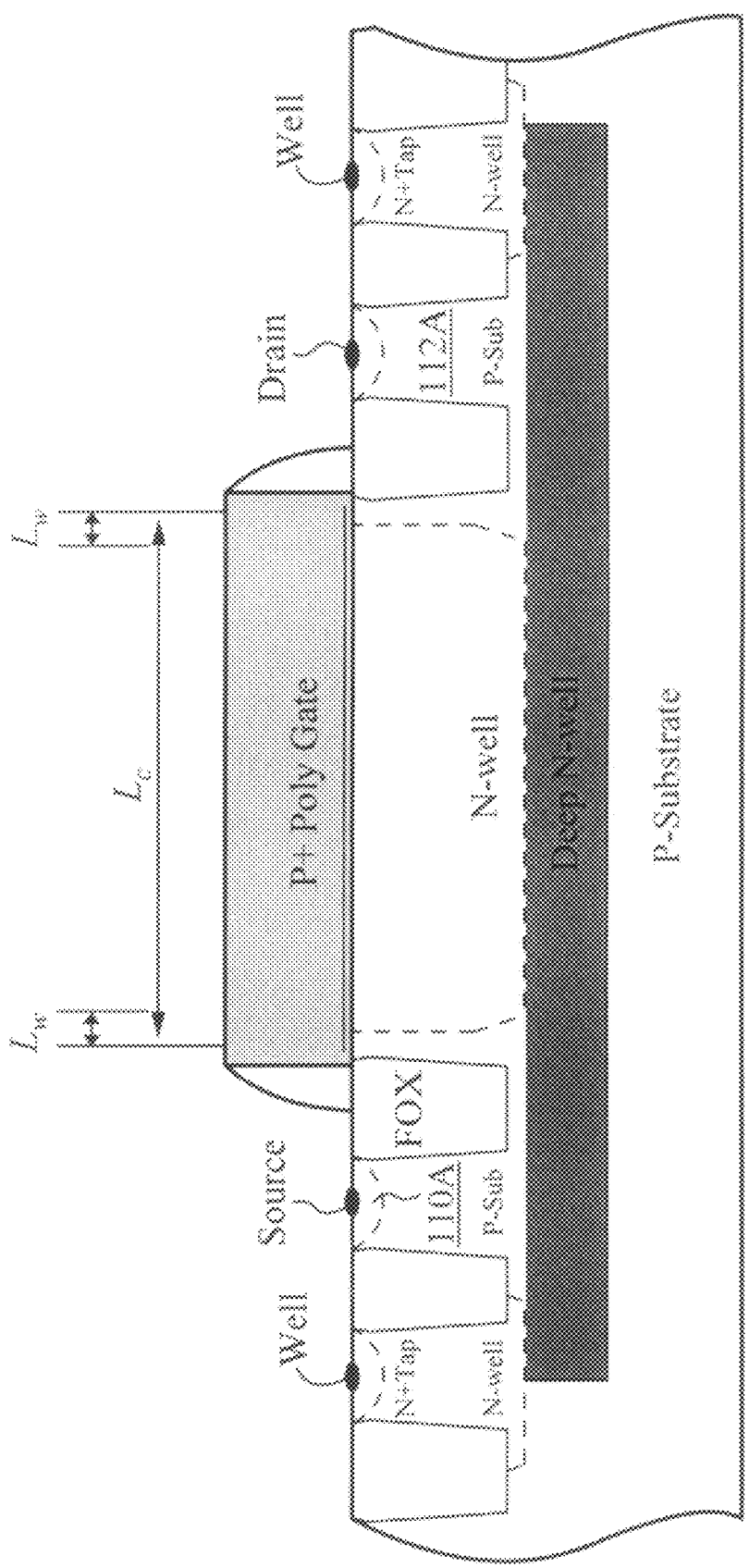
FIG. 8 is an elevational cross-sectional diagram of a high-voltage p-channel LDMOSFET in accordance with another embodiment of the present invention.

Turning now to FIG. 8, a slight variation of the device of FIG. 7 is presented. The device is in all respects except one the same as that of FIG. 7. The difference is that instead of p-wells 110 and 112 the device is provided with p- substrate material at locations 110a and 112a. The advantage of this approach is that the n- well to p-substrate junction has a higher breakdown voltage due to the 2 orders of magnitude less doping of the p- substrate material as compared to the p-well material of the FIG. 7 embodiment.

The high-voltage devices of the invention may be used in a number of applications. Three such applications are described by way of example, but not limitation. In all three embodiments that follow, two transistors are coupled together. At least one of them, and optionally both of them, are LDMOSFET as described above. Further, they are symmetric in that where the first transistor is an LDPMOS, the second transistor is an LDNMOS.

Figure 1:
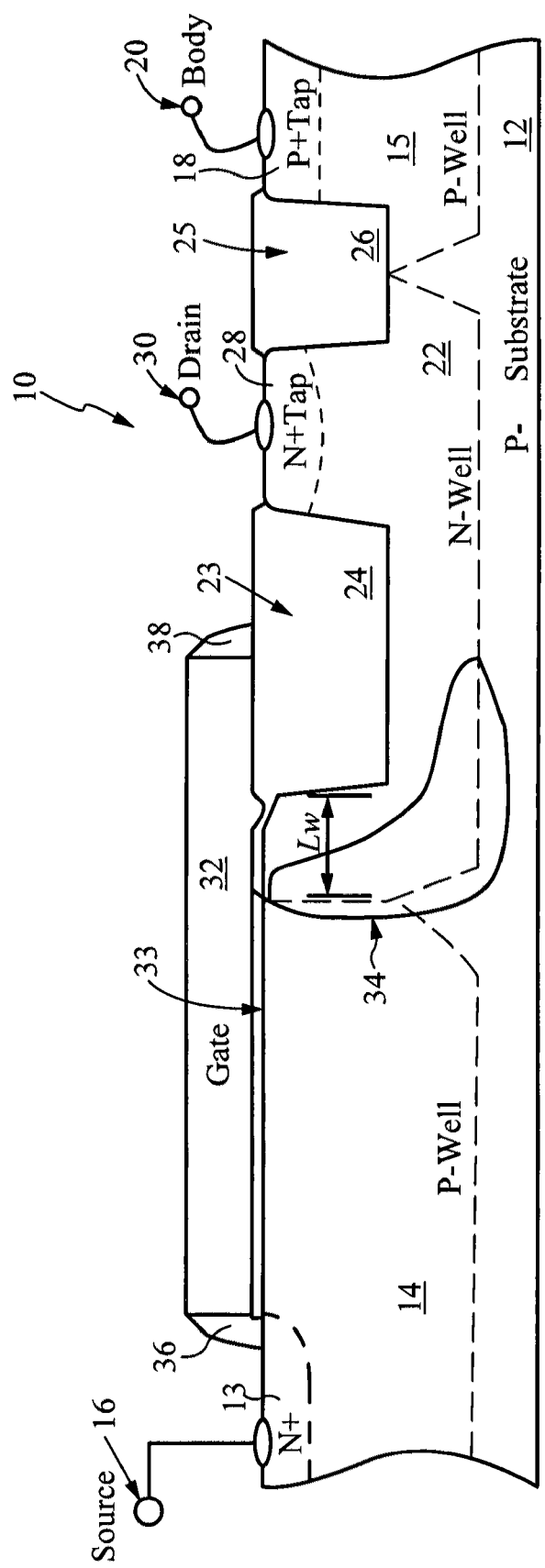
FIG. 1 is an elevational cross-sectional diagram of a lateral diffusion n-channel MOSFET in accordance with the prior art.
Figure 2:
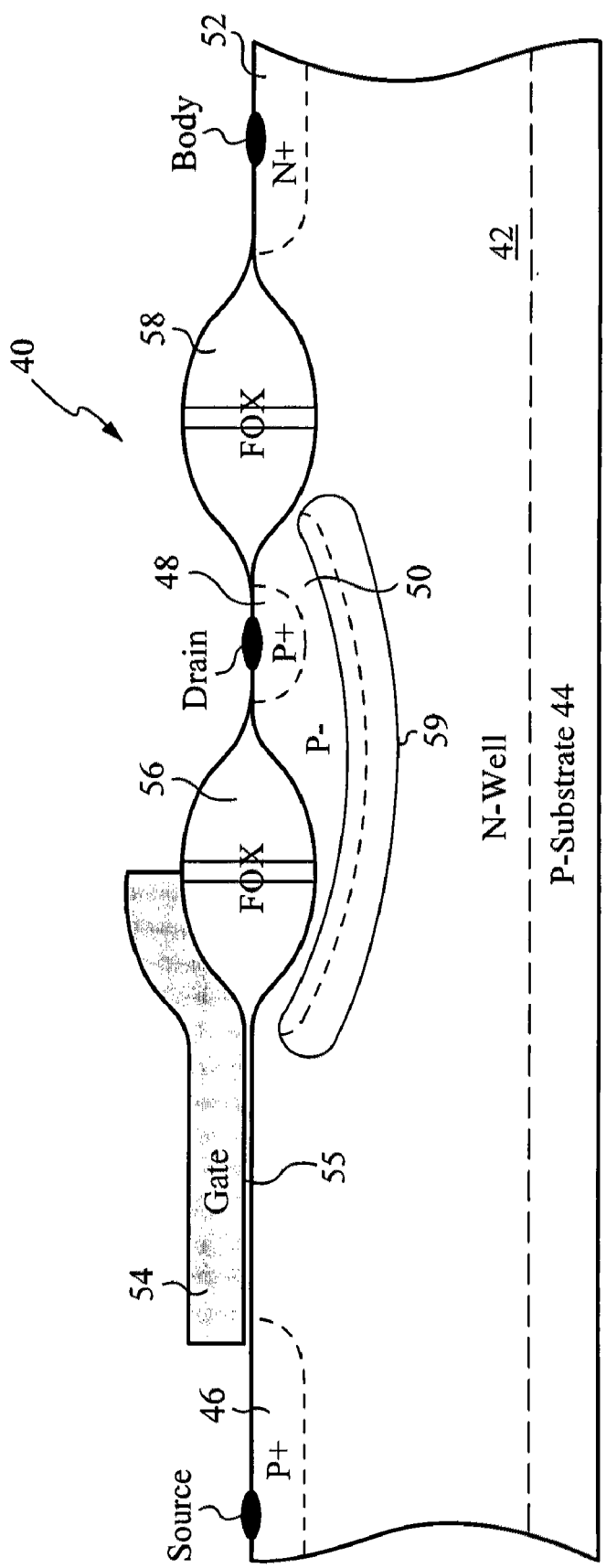
FIG. 2 is an elevational cross-sectional diagram of a lateral diffusion p– channel MOSFET in accordance with the prior art.
Figure 9:
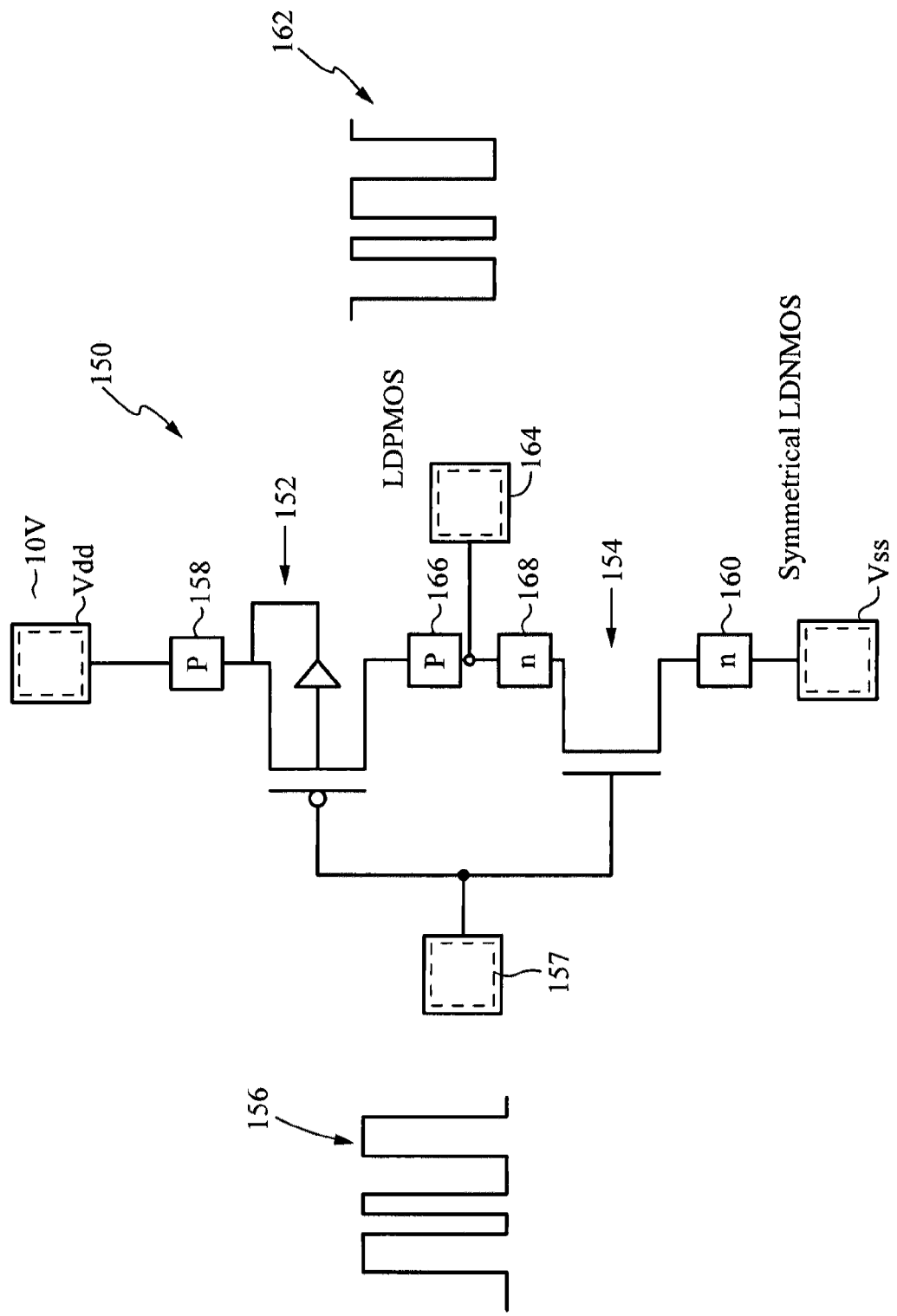
FIG. 9 is a circuit diagram showing a high-voltage inverter formed with a p-channel LDMOSFET in accordance with an embodiment of the present invention.

In FIG. 9 a high-voltage inverter 150 is shown. It comprises a high-voltage pFET (LDPMOS) 152 and a symmetrical LDNMOS 154 (which may be similar to that of FIG. 1 but with high-voltage source and drain) coupled in series as shown. An input signal 156 is applied to the node 157 coupled to the gates of transistors 152 and 154, a Vdd power source of about 10V may be applied to the source 158 of LDPMOS 152, Vss (ground) may be applied to the source 160 of symmetrical LDNMOS 154, and the inverted signal 162 is available at the node 164 coupled to the drains 166 and 168 of transistors 152 and 154, respectively.

Figure 10:
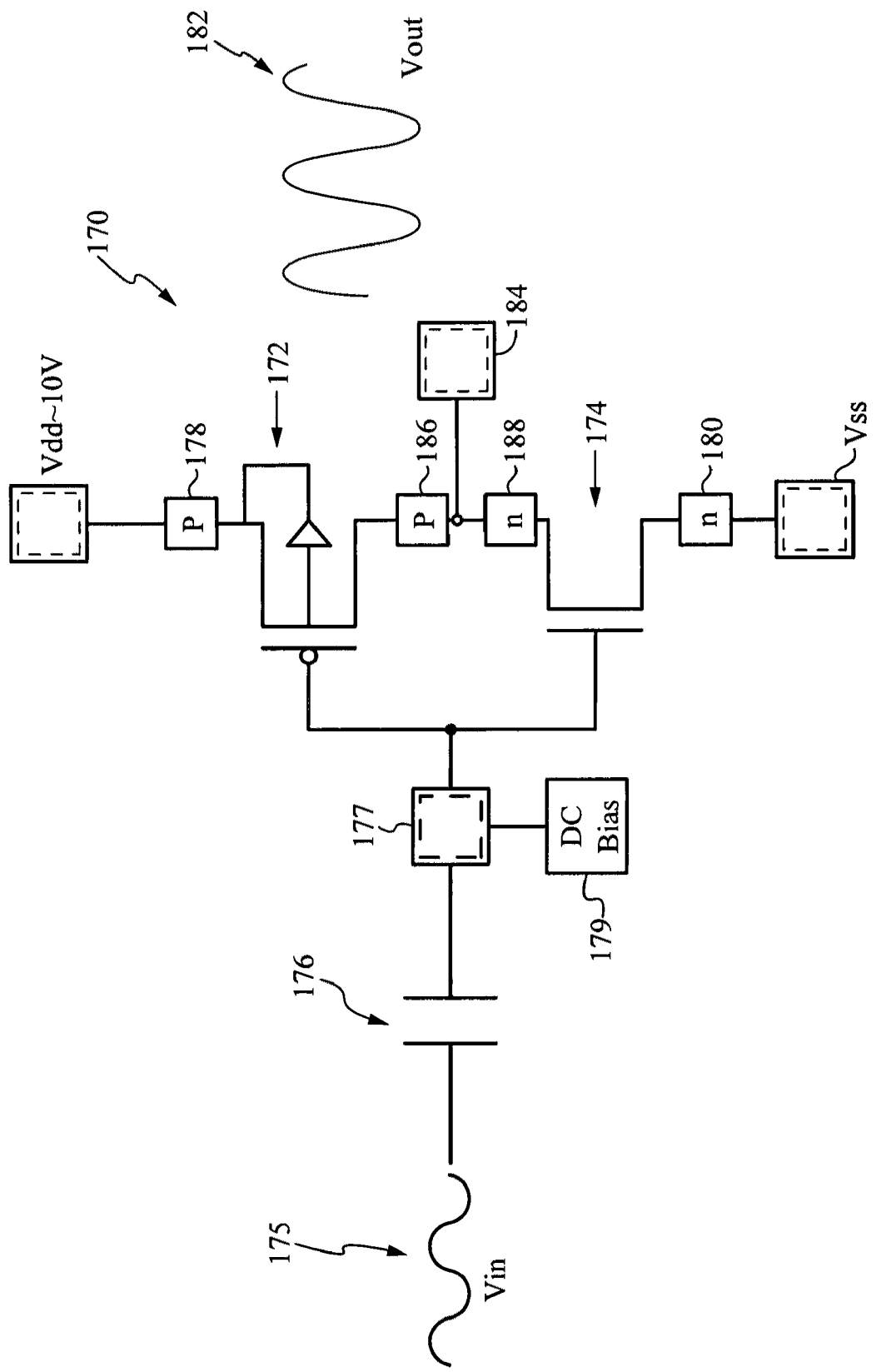
FIG. 10 is a circuit diagram showing a high-output-voltage analog amplifier formed with a p-channel LDMOSFET in accordance with an embodiment of the present invention.

In FIG. 10 a high-voltage output analog amplifier circuit 170 is shown. It comprises a high-voltage pFET (LDPMOS) 172 and a high-voltage LDNMOS 174 (similar to that of FIG. 1) coupled in series as shown. An input signal 175 is applied through a DC blocking capacitor 176 to the node 177 coupled to the gates of transistors 172 and 174, a source 179 of DC bias voltage may be provided for node 177, a Vdd power source of about 10V may be applied to the source 178 of LDPMOS 172, Vss (ground) may be applied to the source 180 of LDNMOS 174 (a symmetrical LDNMOS is not required in this application), and the amplified signal 182 is available at the node 184 which is, in turn, coupled to the drains 186 and 188 of transistors 172 and 174, respectively.

The present invention may be further used in terms of providing a low cost output driver. Such can be used in a number of applications, such as for System On a Chip (SOC), and so on. An example of that is described below.

Figure 11:
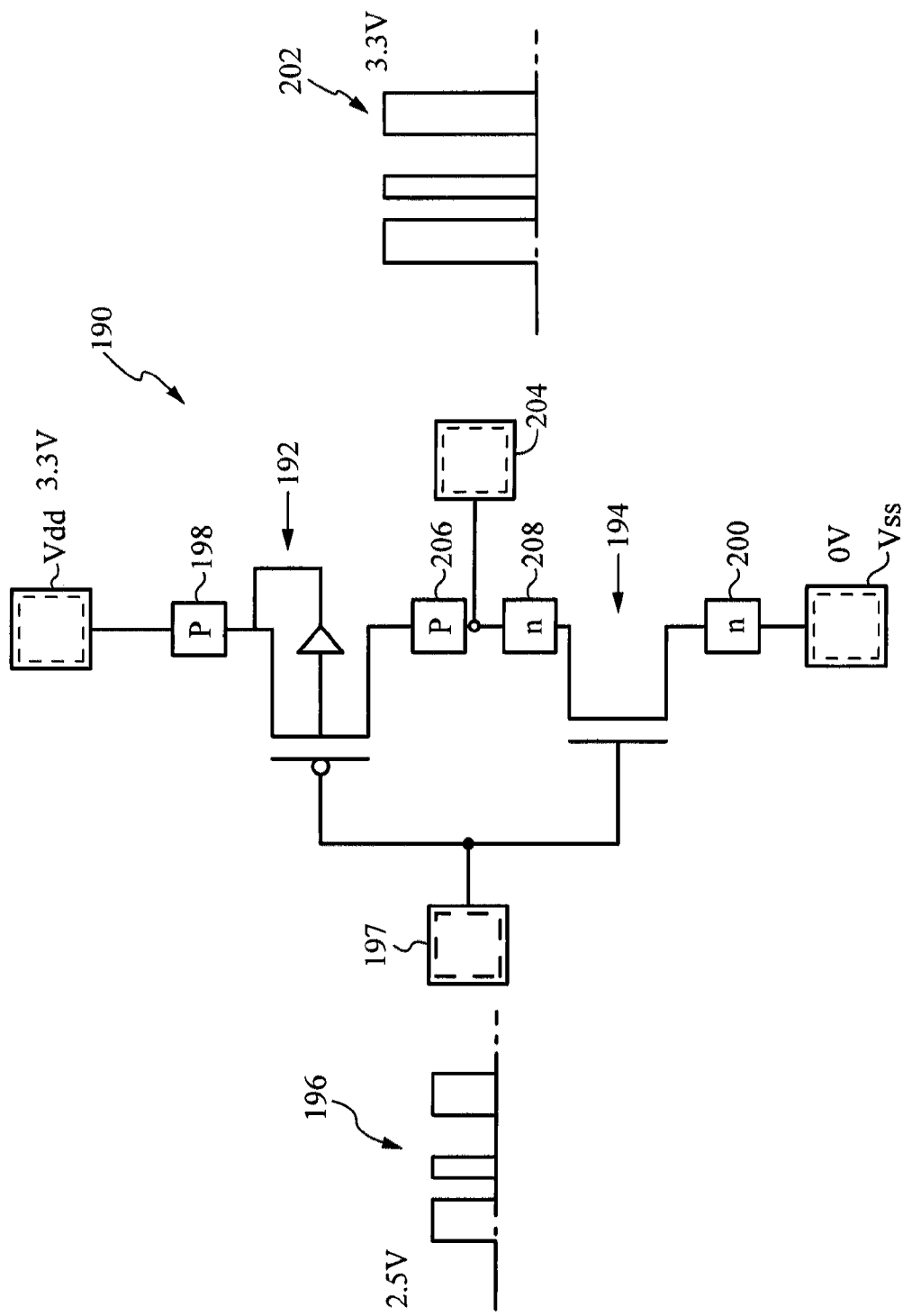
FIG. 11 is a circuit diagram showing a high-voltage digital output circuit for a lower-voltage integrated circuit device incorporating a p-channel LDMOSFET in accordance with an embodiment of the present invention.

In FIG. 11 a high-voltage output driver 190 is shown. It comprises a high-voltage pFET (LDPMOS) 192 and a high-voltage LDNMOS 194 (similar to that of FIG. 1) coupled in series as shown. An input signal 196 is applied to the node 197 coupled to the gates of transistors 192 and 194. A Vdd power source of the desired output peak level may be applied to the source 198 of LDPMOS 192. A Vss (ground) may be applied to the source 200 of LDNMOS 194. It is noteworthy that the desired output peak level here is 3.3 VDC, but a different value could be used for the application. The converted signal 202 is available at the node 204, coupled to the drains 206 and 208 of transistors 192 and 194, respectively.

The present invention may be easily implemented in many standard MOS processes supporting deep n- wells. It makes possible to fabricate high voltage transistors, such as PMOS, in standard CMOS process.

While embodiments and applications of this invention have been shown and described, it will now be apparent to those skilled in the art having the benefit of this disclosure that many more modifications than mentioned above are possible without departing from the inventive concepts disclosed herein. Therefore, the appended claims are intended to encompass within their scope all such modifications as are within the true spirit and scope of this invention.

The claimed invention is:

1. A high-voltage MOSFET, comprising:
a substrate that includes at least:
   a source well region of a first conductivity type having a source contact;
   a drain well region of the first conductivity type having a drain contact;
   a gate well region of a second conductivity type, disposed between the source well region and the drain well region, coming into contact with the source well region at a first junction and coming into contact with the drain well region at a second junction, wherein the gate well region is further disposed under a conductive gate and extends no further laterally than the conductive gate and the source well and the drain well regions,
   a first biasing well region of the second conductivity type having a first biasing well contact;
   a first isolation structure disposed within one of the source well region and the drain well region between the gate well region and the contact of the one of the source well region and the drain well region, the first isolation structure extending within the one of the source well region and the drain well region to a depth deeper than the first junction or the second junction; and
   a deep well region of the second conductivity type extending under the source well region and the drain well region at a depth deeper than the first isolation structure and electrically coupled to the gate well region and the first biasing well region.

2. The device of claim 1, wherein:
the first conductivity type is n.

3. The device of claim 1, wherein:
the first conductivity type is p.

4. The device of claim 1, wherein:
the substrate is further doped according to the first conductivity type.

5. The device of claim 4, wherein:
the first conductivity type is n.

6. The device of claim 4, wherein:
the first conductivity type is p.

7. The device of claim 1, further comprising:
a second isolation structure disposed within the other one of the source well region and the drain well region between the gate well region and the contact of the one of the source well region and the drain well region, the second isolation structure extending to a depth deeper than the first junction or the second junction.

8. The device of claim 1, further comprising:
a second isolation structure disposed between the first biasing well and one of the source well region and the drain well region.

9. The device of claim 1, further comprising:
a second biasing well region of the second conductivity type having a second biasing well contact, the first biasing well region disposed adjacent the source well region and the second biasing well region disposed adjacent the drain well region, wherein the second biasing well is electrically coupled to the deep well region.

10. The device of claim 9, wherein
the first biasing well region, the second biasing well region and the deep well region insulate the source well region and the drain well region from the substrate.

11. The device of claim 10, wherein:

the first conductivity type is n.

12. The device of claim 10, wherein:

the first conductivity type is p.

13. The device of claim 10, wherein:

the substrate is further doped according to the first conductivity type.

14. The device of claim 10, further comprising:

a second isolation structure disposed within the other one of the source well region and the drain well region between the gate well region and the contact of the one of the source well region and the drain well region, the second isolation structure extending within the well region to a depth deeper than the first junction or the second junction.

15. The device of claim 10, further comprising:

a second isolation structure disposed between the first biasing well and one of the source well region and the drain well region.

16. The device of claim 1, wherein an insulating layer is disposed between the conductive gate and the source well region, the drain well region and the gate well region.

17. The device of claim 1, wherein the first isolation structure substantially extends from the top of the substrate to the deep well region of the second conductivity type.

18. The device of claim 10, wherein an insulating layer is disposed between the conductive gate and the source well region, the drain well region and the gate well region.

19. The device of claim 14, wherein the first and second isolation structures substantially extend from the top of the substrate to the deep well region.

* * * * *